(12) United States Patent
Dortu et al.

(10) Patent No.: US 7,092,300 B2
(45) Date of Patent: Aug. 15, 2006

(54) MEMORY APPARATUS HAVING A SHORT WORD LINE CYCLE TIME AND METHOD FOR OPERATING A MEMORY APPARATUS

(75) Inventors: Jean-Marc Dortu, München (DE); Wolfgang Spirkl, Germering (DE)

(73) Assignee: Infineon Technologies AG, Munich (DE)

( * ) Notice: Subject to any disclaimer, the term of this patent is extended or adjusted under 35 U.S.C. 154(b) by 78 days.

(21) Appl. No.: 10/822,997

(22) Filed: Apr. 13, 2004

(65) Prior Publication Data
US 2005/0135139 A1 Jun. 23, 2005

(30) Foreign Application Priority Data
Apr. 14, 2003 (DE) ................. 103 17 162

(51) Int. Cl.
*G11C 7/10* (2006.01)
(52) U.S. Cl. .................. 365/189.05; 365/222
(58) Field of Classification Search ......... 365/222, 365/189.05
See application file for complete search history.

(56) References Cited

U.S. PATENT DOCUMENTS

| | | | | |
|---|---|---|---|---|
| 5,608,682 A | * | 3/1997 | Jinbo et al. ............ | 365/222 |
| 6,178,479 B1 | * | 1/2001 | Vishin ................... | 711/106 |
| 6,801,980 B1 | * | 10/2004 | Ji et al. ................ | 711/105 |
| 6,879,540 B1 | * | 4/2005 | Maruyama et al. ...... | 365/233 |
| 6,885,591 B1 | * | 4/2005 | Nong ................... | 365/189.05 |
| 2002/0161967 A1 | | 10/2002 | Kirihata et al. ......... | 711/105 |

FOREIGN PATENT DOCUMENTS

WO WO 2005/008674 A2 * 1/2005

OTHER PUBLICATIONS

German Examination Report dated Apr. 14, 2003.

* cited by examiner

*Primary Examiner*—Andrew Q. Tran
(74) *Attorney, Agent, or Firm*—Patterson & Sheridan L.L.P.

(57) ABSTRACT

Memory apparatus having a short word line cycle time and method for operating a memory apparatus. One embodiment provides a memory apparatus comprising at least one cell array having a multiplicity of memory cells, with each of the memory cells having an associated word line and an associated bit line; a control device which has a signaling connection to the word lines and to the bit lines and is configured to read data stored in the memory cells and to write data to the memory cells; wherein the control device is configured to execute a destructive read command (DRD) for reading data from at least one of the memory cells, comprising: electrically biasing a bit line associated with the at least one memory cell, opening a word line associated with the at least one memory cell, and destructively reading data stored in the at least one memory cell.

17 Claims, 2 Drawing Sheets

MEMORY APPARATUS HAVING A SHORT WORD LINE CYCLE TIME AND METHOD FOR OPERATING A MEMORY APPARATUS

CROSS-REFERENCE TO RELATED APPLICATIONS

This application claims foreign priority benefits under 35 U.S.C. §119 to co-pending German patent application number 103 17 162.2-55, filed Apr. 14, 2003. This related patent application is herein incorporated by reference in its entirety.

BACKGROUND OF THE INVENTION

1. Field of the Invention

The invention relates to a memory apparatus and to a method for reading data from memory cells in a memory apparatus.

2. Description of the Related Art

Two fundamental parameters of memory apparatuses, particularly modern DRAM memory apparatuses, are the "word line cycle time" (row cycle time) $t_{RC}$ and the "read latency" $t_{RL}$. The word line cycle time $t_{RC}$ is the minimum period of time which elapses between opening word lines in the same memory bank. The read latency $t_{RL}$ denotes the time delay between a read command RD and valid data at the data output of the memory apparatus.

The maximum bandwidth which can be attained for random access to memory cells in a memory cell array in a memory apparatus is ultimately limited by the word line cycle time $t_{RC}$. Thus, from the input of a read command up to the output of valid data at the data output of the memory apparatus, a maximum period of time known as the "effective" read latency $t_{RL}(\text{eff})$ elapses in practice. This effective read latency $t_{RL}(\text{eff})$ is the maximum period of time which is required to terminate the preceding word line cycle (i.e., $t_{RC}$) and the "intrinsic" read latency $t_{RL}$, as expressed in the following equation:

$$t_{RL}(\text{eff}) = t_{RC} + t_{RL}$$

To attain the smallest possible effective read latency $t_{RL}(\text{eff})$, a short word line cycle time $t_{RC}$ thus needs to be made possible, which means that $t_{RC}$ is a fundamental parameter for fast memory apparatuses.

Although other fundamental parameters of modern semiconductor memory apparatuses, particularly their power consumption, the maximum clock frequency, the scale of integration, etc., have been constantly improved with each new semiconductor memory generation in recent time, the reduction in the word line cycle time $t_{RC}$, which is desirable from the above viewpoints, has been comparatively small in past years.

The physical parameters determining the word line cycle time $t_{RC}$ are essentially parasitic capacitances and line resistances. It has been found that these physical parameters are improved only to an insignificant extent with the progress in modern semiconductor technology, if any improvement can be seen at all. In addition, increases in the size of the cell arrays generally result in an increase in parasitic influences, which have a disadvantageous effect on $t_{RC}$ if disadvantageously great use of silicon area is not accepted.

To simplify understanding of the invention which will be explained later, the text below describes the timing of a typical word line cycle (row cycle) in a conventional DRAM store. Although the exemplary description is directed at a DRAM store in this case, similar designs are often also implemented for other memory architectures, such as SRAMs.

A typical minimum word line cycle (row cycle) in a DRAM store having a multiplicity of memory cells, where each of the memory cells has an associated word line and an associated bit line, comprises the following three sequences:

1. A Word Line Opening and Data Reading Step (BLSENS)

In this step, the word line in question is "opened", i.e., the cell transistors for the memory cells which are connected to the word line are put into an electrically conductive state. The storage capacitors for the memory cells are thus conductively connected to their respective associated bit lines, which means that the data stored in the memory cells can be read in a known manner. The time $t_{BLSENS}$ required for opening the word line and for reading the data stored in the memory cells is thus determined preliminarily by that time which is needed to open the word line, to develop the bit line signal and to read the data to a register.

2. A Writing or Charging Step (CHARGE)

When a word line is open, new data can be written to the desired memory cell capacitor by applying a suitable voltage to the respective bit line using a write command. If a write command is not involved but rather a read command, then the data previously read in step 1 (BLSENS) are written back to the memory cell capacitor in the same way to bring its voltage signal back to the prescribed nominal value. In a similar manner, a refresh command also involves the data previously read in step 1 being written back to the memory cell capacitor. The delay $t_{CHARGE}$ which results from this charging step is thus determined essentially by the available charging current and also by the capacitance of the memory cell capacitor for the DRAM memory cells.

3. An Electrical "Biasing Step" or Erasure Step for the Bit Lines (Precharge, BLPRE)

Since, following execution of the charging step (CHARGE), as described above under step 2, the bit lines are either at the predetermined lower voltage potential or at the predetermined upper voltage potential, the bit lines first need to be brought to a suitable predetermined voltage potential to prepare the bit lines for a fresh opening and reading step (BLSENS), i.e., the bit lines need to be electrically "biased" to a suitable voltage potential, which is also called "erasing" the bit lines. Erasing the bit lines has an associated time delay $t_{BLPRE}$.

The three time delays $t_{BLSENS}$, $t_{CHARGE}$ and $t_{BLPRE}$ cited above result altogether in the (minimum) word line cycle time $t_{RC}$ (row cycle time). Between write, read and refresh commands, there is no difference in terms of the minimum word line cycle time $t_{RC}$ required.

SUMMARY OF THE INVENTION

It is an object of the invention to specify a memory apparatus which has a relatively short word line cycle time (row cycle time) $t_{RC}$. It is also an object of the invention to specify a corresponding method for reading data from memory cells in such a memory apparatus.

One embodiment provides a memory apparatus comprising: at least one cell array having a plurality of memory cells, each memory cell having an associated word line and an associated bit line and a control device having a signaling connection to a plurality of word lines and bit lines, wherein the control device is configured to execute a destructive read command for reading data from at least one memory cell, the destructive read command comprising: electrically biasing a bit line associated with the at least one memory cell; opening a word line associated with the at least one memory cell; and destructively reading data stored in the at least one memory cell. The control device may be further configured to execute a write command for writing data to at least one memory cell, the write command comprising: writing data to the at least one memory cell without first reading stored data in the memory cell. Furthermore, the control device may be configured to execute a nondestructive read command and executing a refresh command.

Another embodiment provides a method for operating a plurality of memory cells in a memory apparatus, the method comprising: executing a destructive read command for reading data from at least one memory cell, the destructive read command, comprising: electrically biasing the bit line associated with the at least one memory cell; opening the word line associated with the at least one memory cell; and destructively reading data stored in the at least one memory cell. The method may further comprise executing a destructive write command for writing data from at least one memory cell, the destructive write command comprising: writing the data to the at least one memory cell without first reading stored data in the memory cell. The method may further comprise executing a nondestructive read command and executing a refresh command.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
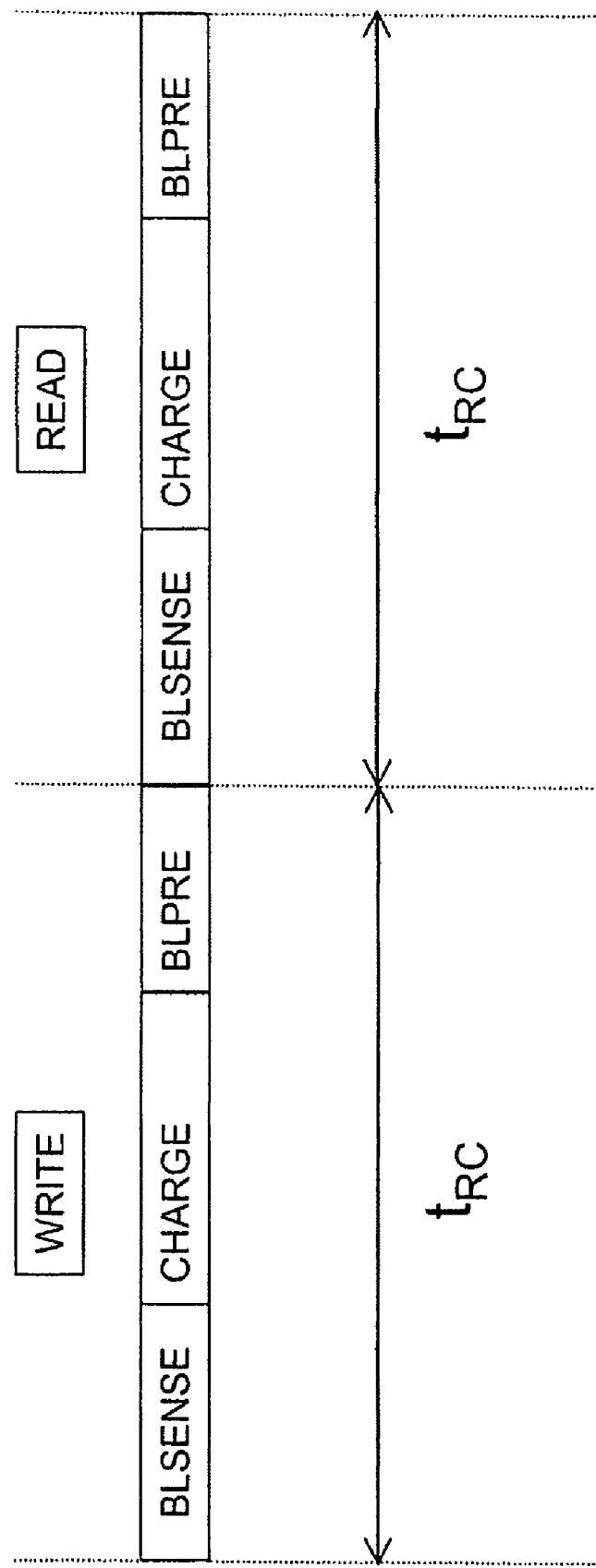
FIG. 1 is a schematic timing diagram for minimum word line cycles showing a write command and a read command in a conventional DRAM device.

FIG. 1 shows conventional minimum DRAM word line cycles for a write command and a read command. As described above, a write cycle comprises, as a minimum, the steps BLSENS, CHARGE and BLPRE. The minimum word line cycle time is thus $t_{RC} = t_{BLSENS} + t_{CHARGE} + t_{BLPRE}$. The minimum read cycle (READ) corresponds, in terms of its timing, exactly to one minimum write cycle (WRITE) and has an identical minimum word line cycle length.

Figure 2:
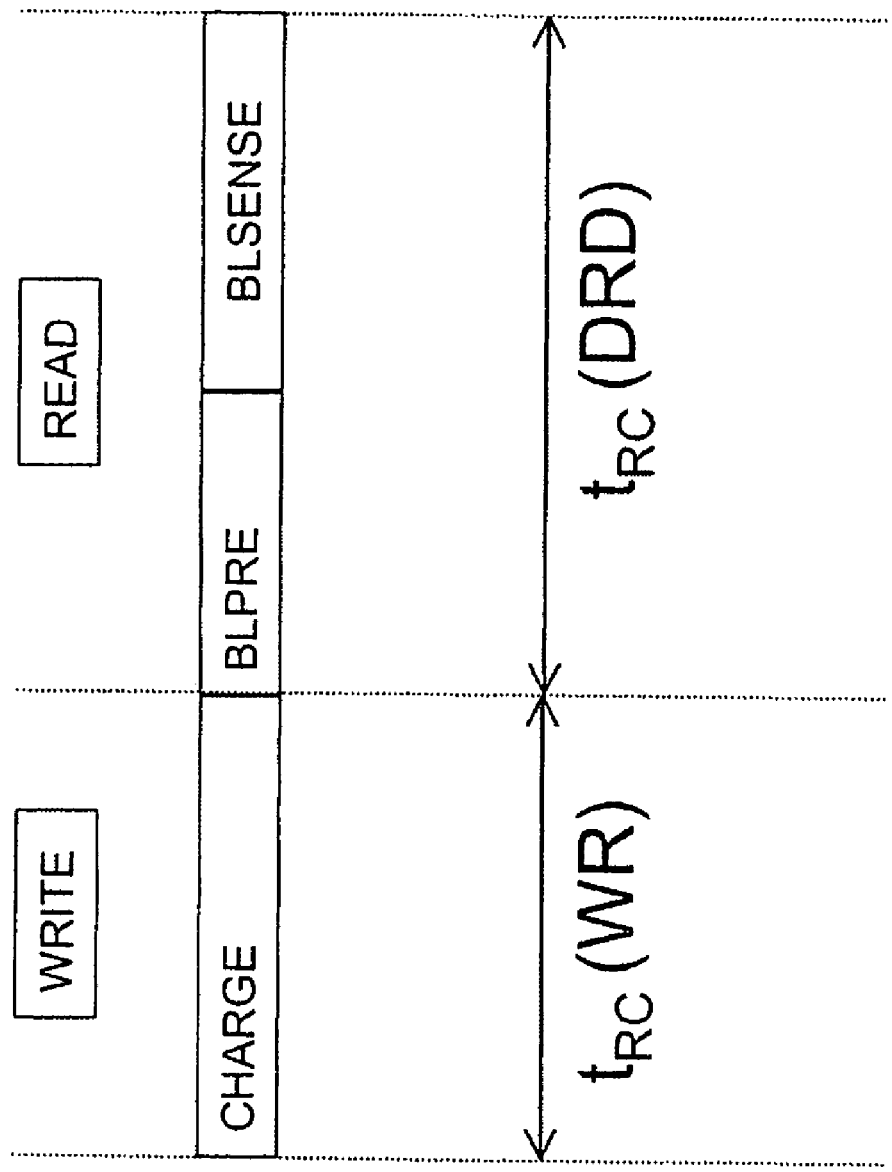
FIG. 2 is a schematic timing diagram for minimum word line cycles illustrating a write cycle and a read cycle in a memory apparatus in accordance with one embodiment of the invention.

FIG. 2 shows a timing diagram for minimum word line cycles in a memory apparatus in accordance with one embodiment of the invention. The figure shows a write cycle, entitled "WRITE", and a read cycle, entitled "READ". The read cycle comprises the steps BLPRE for electrically biasing or erasing the bit lines in question and also the step BLSENSE for opening the word lines and reading the data from the memory cells to a register. Unlike minimum word line cycles in conventional memory apparatuses, the inventive word line cycle involves no writing of the data which have been read back to the memory cells. In addition, the design of the read cycle sequence has been reshaped by virtue of the cycle not starting—as conventionally—with the step BLSENS but rather with the step BLPRE.

The minimum word line cycle time $t_{RC}(DRD)$ for the destructive read command DRD is thus $t_{BLPRE} + t_{BLSENSE}$. The write cycle comprises only the step CHARGE, i.e., the writing of data to the cell capacitors for the memory cells, which means that a minimum word line cycle time for the write command WR of $t_{RC}(WR)$ is obtained. The control device can be configured such that the minimum word line cycle time $t_{RC}(WR)$ is equal to the minimum word line cycle time $t_{RC}(DRD)$.

A fundamental advantage provided by embodiments of the invention is the complete separation of the timing of write cycles ($t_{CHARGE}$) and read cycles ($t_{BLPRE} + t_{BLSENSE}$). This is particularly advantageous when the write and read timings differ considerably. In this case, it is advantageously possible to provide different $t_{RC}$ values for write and read cycles.

One implementation comprises the following commands, which can be accessed by the user of a memory apparatus in accordance with one embodiment of the invention:
 a) WR: write command;
 b) DRD: destructive read command (once only read);
 c) RRD: nondestructive read (repetitive read); and
 d) REF: refresh command (refresh operation).

The nondestructive read command RRD is made up of a destructive read command DRD and a subsequent write command WR, so that $t_{RC}(RRD) = t_{RC}(WR) + t_{RC}(DRD)$. In one embodiment of the inventive memory apparatus, only that part of a word line which is used by the command should be opened. This may be done using a segmented word line architecture, which is already used in many memory architectures, for example RLDRAMs (Reduced Latency DRAM), particularly RLDRAM1, for other performance reasons, however. This design involves each word line being associated with 1024 bit lines. Assuming 16 bit per bank and a burst length of 8, 128 bits are read. It is thus necessary to divide the word line into 1024/128=8 segments. This appears to be acceptable if the $t_{RC}$ reduction which can be attained therewith is considered, which would be difficult to attain elsewhere. For a burst length of BL=2, a segmentation factor of 32 would result, however.

The invention thus allows a significant reduction in the minimum word line cycle time without presupposing improved technological parameters.

One embodiment of the invention provides a memory apparatus comprising: at least one cell array having a multiplicity of memory cells, with each of the memory cells having an associated word line and an associated bit line; a control device which has a signaling connection to the word lines and to the bit lines and is configured to read data stored in the memory cells and to write data to the memory cells; wherein the control device is configured to execute a destructive read command for reading data from at least one of the memory cells, which comprises electrical biasing or erasure of at least the bit line which is associated with the at least one memory cell, electrical biasing or erasure of at least the bit line which is associated with the at least one memory cell, opening of the word line which is associated with the at least one memory cell, and destructive reading of the data stored in the at least one memory cell.

The control device for a memory apparatus in accordance with one embodiment of the invention is thus configured to execute a destructive read command (or "read-once", DRD) with a different word line cycle than the prior art. The control device is thus configured such that a word line cycle, when executing a destructive read command, starts by electrically biasing or erasing the bit line (BLPRE) which is associated with the at least one memory cell. In this context, reference is made to the definitions and statements made for the description of the prior art, which also relate to the invention in terms of the general explanations and definitions of terms.

Unlike in a conventional word line cycle, the word line cycle in a memory apparatus in accordance with the invention thus starts with the step BLPRE, i.e., erasure of the associated bit lines. Next, the word line which is associated with the at least one memory cell is "opened," and the data stored in the at least one memory cell are destructively read, i.e., the opening and reading step called BLSENS above is carried out. When the step BLSENS is complete, the minimum word line cycle in the inventive memory apparatus is at an end, since the previously read data are not written back to the memory cells, which means that the charging step CHARGE always required in the prior art is dispensed with. The data read from the at least one memory cell, i.e., generally a binary information item, are provided at the data output of the memory apparatus.

For a destructive read command, a minimum word line cycle time $t_{RC}(DRD)=t_{BLPRE}+t_{BLSENS}$ is thus obtained. This minimum word line cycle time $t_{RC}(DRD)$ is shorter than the minimum word line cycle time $t_{RC}=t_{BLSENS}+t_{CHARGE}+t_{BLPRE}$ in conventional memory apparatuses. Unlike in known memory apparatuses, the read command does not end with the execution of an erasure step BLPRE for the bit lines. Instead, the design of the word line cycle is rearranged, wherein the word line cycle involving the erasure step BLPRE is placed at the start of the cycle for the purpose of executing a read command. The reduced minimum word line cycle time $t_{RC}(DRD)$ means that the "effective" read latency $t_{RL}(eff)$ is also reduced, so that a relatively wider bandwidth can be attained for random access to the memory cell array.

In one embodiment of a memory apparatus, the control device is additionally configured to execute a write command (WR) for writing data to at least one of the memory cells, the write command comprising writing of the data to the at least one memory cell without prior reading of the data stored in the memory cell.

Unlike conventional memory apparatuses, one embodiment of the inventive memory apparatus thus proposes splitting the conventionally common word line cycle for read and write commands into separate, shorter cycles for destructive reading and writing. For the minimum word line cycle for a write command, the steps BLSENS and BLPRE required in the prior art are thus dispensed with, which means that the minimum word line cycle time for a write command can be shortened considerably as compared with the prior art. In one embodiment, $t_{RC}(WR)=t_{RC}(CHARGE)$, i.e., a write command thus does not involve prior reading of the data from the memory cell before (new) data are written to the memory cell.

In another embodiment of a memory apparatus, the control device is additionally configured to execute a nondestructive read command (RRD) for reading data from at least one of the memory cells, the nondestructive read command comprising electrically biasing a bit line which is associated with the at least one memory cell, opening of a word line which is associated with the at least one memory cell, destructive reading of the data stored in the at least one memory cell, and writing the read data to the at least one memory cell.

To execute the nondestructive read command, the control device is configured such that, following the destructive reading step, the data which have been read are written back to the at least one memory cell from the register. The execution of a nondestructive read command thus essentially comprises the execution of a destructive read command with a subsequent write command for writing the data which have been read back to the memory cell. Thus, a minimum word line cycle time $t_{RC}(RRD)=t_{RC}(DRD)+t_{RC}(WR)$, where RRD stands for "repetitive read", is obtained for the execution of a nondestructive read command.

In another embodiment, the control device is additionally configured to execute a refresh command for refreshing data in at least one of the memory cells, the refresh command comprising: electrical biasing of at least the bit line which is associated with the at least one memory cell, opening of the word line which is associated with the at least one memory cell, destructive reading of the data stored in the at least one memory cell, and writing of the read data to the at least one memory cell.

Unlike the case of a nondestructive read command, execution of the refresh command does not require the data to be sent to the data output of the memory apparatus. Such a design for the control device, in terms of the execution of refresh commands for refreshing the data content of the memory cells, is advantageous for DRAM stores, but as explained later, is not absolutely necessary.

In one embodiment, the memory apparatus is a DRAM device. Equally, the inventive concept can also be applied to other memory architectures, particularly SRAM devices.

In one embodiment, the memory apparatus is a buffer storage device, particularly a network buffer storage device. In such an embodiment, it is sometimes possible to dispense with configuring the control device to execute a nondestructive read command and a refresh command. Very fast network buffer storage devices are utilized to buffer-store a datastream for a particular (short) time before the datastream is forwarded to an output device. Typically, the buffer-stored data are read only a single time before they are forwarded, which means that a nondestructive read command (repetitive read) is not required.

In addition, applications are conceivable in which the buffer storage time is shorter than the refresh period, which means that the control device does not need to be configured to execute a refresh command, since the data are actually read within the refresh period.

In one embodiment of the invention, a method for reading data from and writing data to memory cells in a memory apparatus comprises the execution of a destructive read command for reading data from at least one of the memory cells, the read command comprising the steps of electrically biasing the bit line which is associated with the at least one memory cell, opening the word line which is associated with the at least one memory cell, and destructively reading the data stored in the at least one memory cell.

In terms of the inventive method, reference is made to the preceding statements regarding the inventive memory apparatuses described herein. In addition, for general definitions of terms and statements, reference is made to the description of the typical minimum word line cycle in conventional memory apparatuses in recognition of the prior art.

In one embodiment, the method additionally comprises the execution of a write command for writing data to at least one of the memory cells, the write command comprising writing of the data to the at least one memory cell without prior reading of the data stored in the memory cell. The minimum word line cycle time for a write command is thus just the time $t_{CHARGE}$ for charging the memory cells, with no biasing or erasure step for the bit lines (BLPRE) being required.

In another embodiment, the method additionally comprises the execution of a nondestructive read command (RDD or repetitive read) for reading data from at least one of the memory cells, the nondestructive read command comprising the steps of electrically biasing at least the bit line which is associated with the at least one memory cell, opening the word line which is associated with the at least one memory cell, destructively reading the data stored in the at least one memory cell, and writing the read data to the at least one memory cell.

In yet another embodiment, the inventive method additionally comprises the execution of a refresh command for refreshing data in at least one of the memory cells in order to refresh these data, the refresh command comprising the steps of electrically biasing at least the bit line which is associated with the at least one memory cell, opening the word line which is associated with the at least one memory cell, destructively reading the data stored in the at least one memory cell, and writing the read data to the at least one memory cell.

While the foregoing is directed to embodiments of the present invention, other and further embodiments of the invention may be devised without departing from the basic scope thereof, and the scope thereof is determined by the claims that follow.

What is claimed is:

1. A memory apparatus, comprising:
   at least one cell array having a plurality of memory cells, each memory cell having an associated word line and an associated bit line;
   a control device having a signaling connection to a plurality of word lines and bit lines wherein the control device is configured to:
      execute a destructive read command for reading data from at least one memory cell, the destructive read command comprising:
         electrically biasing a bit line associated with the at least one memory cell;
         after electrically biasing, activating a word line associated with the at least one memory cell, thereby connecting the at least one memory cell to the bit line; and
         destructively reading data stored in the at least one memory cell, whereby the read data is destroyed as a result of reading the data; and execute a destructive write command for writing data to the at least one memory cell, the destructive write command comprising:
         writing dat to the at least one memory cell without first reading stored data in the memory cell.

2. The memory apparatus of claim 1, wherein the control device is further configured to execute a nondestructive read command for reading data from at least one of the memory cells, the nondestructive read command comprising:
   electrically biasing the bit line associated with the at least one memory cell;
   after electrically biasing, activating the word line associated with the at least one memory cell, thereby connecting the at least one memory cell to the bit line;
   destructively reading data stored in the at least one memory cell; and
   writing the read data to the at least one memory cell.

3. The memory apparatus of claim 1, wherein the control device is further configured to execute a refresh command for refreshing data stored in at least one memory cell, the refresh command comprising:
   electrically biasing the bit line associated with the at least one memory cell;
   after electrically biasing, activating the word line associated with the at least one memory cell, thereby connecting the at least one memory cell to the bit line;
   destructively reading data stored in the at least one memory cell; and
   writing the read data to the at least one memory cell.

4. The memory apparatus of claim 1, wherein the memory apparatus is a DRAM.

5. The memory apparatus of claim 1, wherein the memory apparatus is an SRAM.

6. The memory apparatus of claim 1, wherein the memory apparatus is a buffer storage device.

7. A method for operating a plurality of memory cells in a memory apparatus, the method comprising:
   executing a destructive read command for reading data from at least one memory cell, the destructive read command, comprising:
   electrically biasing a bit line associated with the at least one memory cell;
   after electrically biasing, activating a word line associated with the at least one memory cell, thereby connecting the at least one memory cell to the bit line; and
   destructively reading data stored in the at least one memory cell, whereby the read data is destroyed as a result of reading the data; and
   executing a destructive write command for writing data to the at least one memory cell, the destructive write command comprising:
   writing the data to the at least one memory cell without first reading stored data in the memory cell.

8. The method of claim 7, further comprising:
   executing a nondestructive read command for reading data from at least one memory cell, the nondestructive read command comprising:
      electrically biasing the bit line associated with the at least one memory cell;
      activating the word line associated with the at least one memory cell, thereby connecting the at least one memory cell to the bit line; and
      destructively reading data stored in the at least one memory cell; and
      writing the read data to the at least one memory cell.

9. The method of claim 8, further comprising:
   executing a refresh command for refreshing data in at least one memory cell, the refresh command comprising:
      electrically biasing the bit line associated with the at least one memory cell;
      activating the word line associated with the at least one memory cell, thereby connecting the at least one memory cell to the bit line;
      destructively reading data stored in the at least one memory cell; and
      writing the read data to the at least one memory cell.

10. The method of claim 7, further comprising:
    executing a nondestructive read command for reading data from at least one memory cell, the nondestructive read command comprising:
       electrically biasing the bit line associated with the at least one memory cell;

after electrically baising activating the word line associated with the at least one memory cell, thereby connecting the at least one memory cell to the bit line; and destructively reading data stored in the at least one memory cell; and writing the read data to the at least one memory cell.

11. The method of claim 7, further comprising:

executing a refresh command for refreshing data in at least one memory cell, the refresh command comprising:

electrically biasing the bit line associated with the at least one memory cell;

activating the word line associated with the at least one memory cell, thereby connecting the at least one memory cell to the bit line;

destructively reading data stored in the at least one memory cell; and writing the read data to the at least one memory cell.

12. A memory apparatus, comprising:

at least one cell array having a plurality of memory cells having associated word lines and associated bit lines;

a control means for:

executing a destructive read command for reading data from at least one memory cell, the destructive read command comprising:

electrically biasing a bit line associated with the at least one memory cell;

after electrically biasing, activating a word line associated with the at least one memory cell, thereby connecting the at least one memory cell to the bit line; and destructively reading data stored in the at least one memory cell, whereby the read data is destroyed as a result of reading the data; and executing a destructive write command for writing data to the at least one memory cell, the destructive write command comprising:

writing data to the at least one memory cell without first reading stored data in the memory cell.

13. The memory apparatus of claim 12, wherein the control means is further configured for executing a nondestructive read command for reading data from at least one of the memory cells, the nondestructive read command comprising:

electrically biasing the bit line associated with the at least one memory cell;

activating the word line associated with the at least one memory cell, thereby connecting the at least one memory cell to the bit line;

destructively reading data stored in the at least one memory cell; and writing the read data to the at least one memory cell.

14. The memory apparatus of claim 13, wherein the control means is further configured for executing a refresh command for refreshing data stored in at least one memory cell, the refresh command comprising:

electrically biasing the bit line associated with the at least one memory cell;

activating the word line associated with the at least one memory cell, thereby connecting the at least one memory cell to the bit line;

destructively reading data stored in the at least one memory cell; and writing the read data to the at least one memory cell.

15. The memory apparatus of claim 14, wherein the memory apparatus is a DRAM.

16. The memory apparatus of claim 14, wherein the memory apparatus is an SRAM.

17. The memory apparatus of claim 14, wherein the memory apparatus is a buffer storage device.

* * * * *

UNITED STATES PATENT AND TRADEMARK OFFICE
CERTIFICATE OF CORRECTION

PATENT NO.       : 7,092,300 B2                                            Page 1 of 1
APPLICATION NO.  : 10/822997
DATED            : August 15, 2006
INVENTOR(S)      : Dortu et al.

It is certified that error appears in the above-identified patent and that said Letters Patent is hereby corrected as shown below:

In claim 1, at column 7, line 52, replace "dat" with --data--.

Signed and Sealed this

Thirteenth Day of November, 2007

JON W. DUDAS
*Director of the United States Patent and Trademark Office*